(12) United States Patent
Park et al.

(10) Patent No.: US 7,580,198 B2
(45) Date of Patent: Aug. 25, 2009

(54) LENS FOR LIGHT EMITTING DIODE, BACK LIGHT ASSEMBLY HAVING THE SAME, AND LIQUID CRYSTAL DISPLAY HAVING THE ASSEMBLY

(75) Inventors: Se-Ki Park, Suwon-si (KR); Ju-Young Yoon, Suwon-si (KR); Seok-Hyun Nam, Seoul (KR); Gi-Cherl Kim, Yongin-si (KR); Sang-Yu Lee, Yongin (KR)

(73) Assignee: Samsung Electronics Co., Ltd. (KR)

( * ) Notice: Subject to any disclaimer, the term of this patent is extended or adjusted under 35 U.S.C. 154(b) by 517 days.

(21) Appl. No.: 11/367,843

(22) Filed: Mar. 3, 2006

(65) Prior Publication Data
US 2006/0203353 A1 Sep. 14, 2006

(30) Foreign Application Priority Data
Mar. 8, 2005 (KR) ............... 10-2005-0018987

(51) Int. Cl.
G02B 13/08 (2006.01)
G02B 13/18 (2006.01)

(52) U.S. Cl. ................... 359/668; 359/708
(58) Field of Classification Search .......... 359/668, 359/708
See application file for complete search history.

(56) References Cited

U.S. PATENT DOCUMENTS 2,215,900 A 9/1940 Bitner
6,536,923 B1 3/2003 Merz ............. 362/327
6,547,423 B2 4/2003 Marshall et al. ...... 362/333
6,665,128 B1 * 12/2003 Tai ............. 359/668
2002/0085390 A1 7/2002 Kiyomoto et al.
2004/0252390 A1 12/2004 Benitez et al.
2006/0050526 A1 3/2006 Ikeda et al.

FOREIGN PATENT DOCUMENTS

| EP | 1564819 A1 | 8/2005 |
|---|---|---|
| JP | 06-162806 | 6/1994 |
| JP | 07-058362 | 3/1995 |
| JP | 11-163421 | 6/1999 |
| JP | 2000-503431 | 3/2000 |
| JP | 2002-344027 | 11/2002 |
| JP | 2003-8068 | 1/2003 |
| JP | 2004-172579 | 6/2004 |
| KR | 2002-0067533 | 8/2002 |
| KR | 10-0440524 | 7/2004 |
| KR | 10-2004-0087950 | 10/2004 |
| WO | WO2004042833 A1 | 5/2004 |

OTHER PUBLICATIONS

All the references cited in the Search Report are listed above.
European Search Report; Application No. EP06004606; Date: Jun. 19, 2006.

* cited by examiner

Primary Examiner—William C Choi
(74) Attorney, Agent, or Firm—Cantor Colburn LLP

(57) ABSTRACT

An optical lens has a first curved surface. The first curved surface has a first variable curvature. The optical lens has a second curved surface. The second curved surface has a second variable curvature. The second variable curvature forms a protrusion on the second curved surface. A first end of the first curved surface is connected to a first end of the second curved surface at an outer edge of the lens.

23 Claims, 17 Drawing Sheets

LENS FOR LIGHT EMITTING DIODE, BACK LIGHT ASSEMBLY HAVING THE SAME, AND LIQUID CRYSTAL DISPLAY HAVING THE ASSEMBLY

This application claims priority to Korean Patent Application No. 2005-018987, filed on Mar. 8, 2005 and all the benefits accruing therefrom under 35 U.S.C. § 119, the contents of which are herein incorporated by reference in its entirety.

BACKGROUND OF THE INVENTION

1. Field of the Invention

The present invention relates to a lens that distributes light so that the light extends into a certain range, and the light distribution is comparatively uniform in that range.

2. Discussion of the Background

A liquid crystal display (LCD) device displays images using optical characteristics (i.e. refractive anisotropy) and electrical characteristics (i.e. dielectric anisotropy) of liquid crystal. The LCD device has advantageous characteristics such as thinner thickness, lower driving voltage, lower power consumption, etc., than other types of display devices such as a cathode ray tube (CRT) device, a plasma display panel (PDP) device, and the like.

The LCD device is non-emissive type display device, which requires a light source to supply light to a liquid crystal (LC) panel of the LCD device.

The backlight assembly is classified either as an edge illumination type or a direct illumination type based on the location of the light source.

In the edge illumination type, the backlight assembly includes a light guiding plate and one or two light sources adjacent to a side surface of the light guiding plate so that the light generated from the light sources is guided into the LC panel of the LCD device.

In the direct illumination type, the backlight assembly includes a plurality of light sources under the LC panel and a diffusion plate disposed between the LCD panel and the light sources so that the light generated from the light sources is diffused and irradiated into the LC panel.

In general, a small screen LCD device has the edge illumination type backlight assembly with thin thickness and a large screen LCD device has the direct illumination type backlight assembly with high luminance.

When the LCD device has the direct illumination type backlight assembly, it is important that the backlight assembly should provide uniform brightness through the whole area of the backlight assembly.

SUMMARY OF THE INVENTION

This invention provides a lens that distributes light so that the light extends into a certain range, and the light distribution is comparatively uniform in that range.

The present invention also provides a back light assembly that provides relatively uniform brightness through the whole area of the back light assembly.

Additional features of the invention will be set forth in the description which follows, and in part will be apparent from the description, or may be learned by practice of the invention.

An exemplary embodiment of the present invention provides a lens including a first curved surface having a first variable curvature; a second curved surface having s second variable curvature; and a protrusion formed on a center area of the second curved surface. A first end of the first curved surface is connected to a first end of the second curved surface. The second variable curvature forms the protrusion on the second curved surface It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Figure 1:
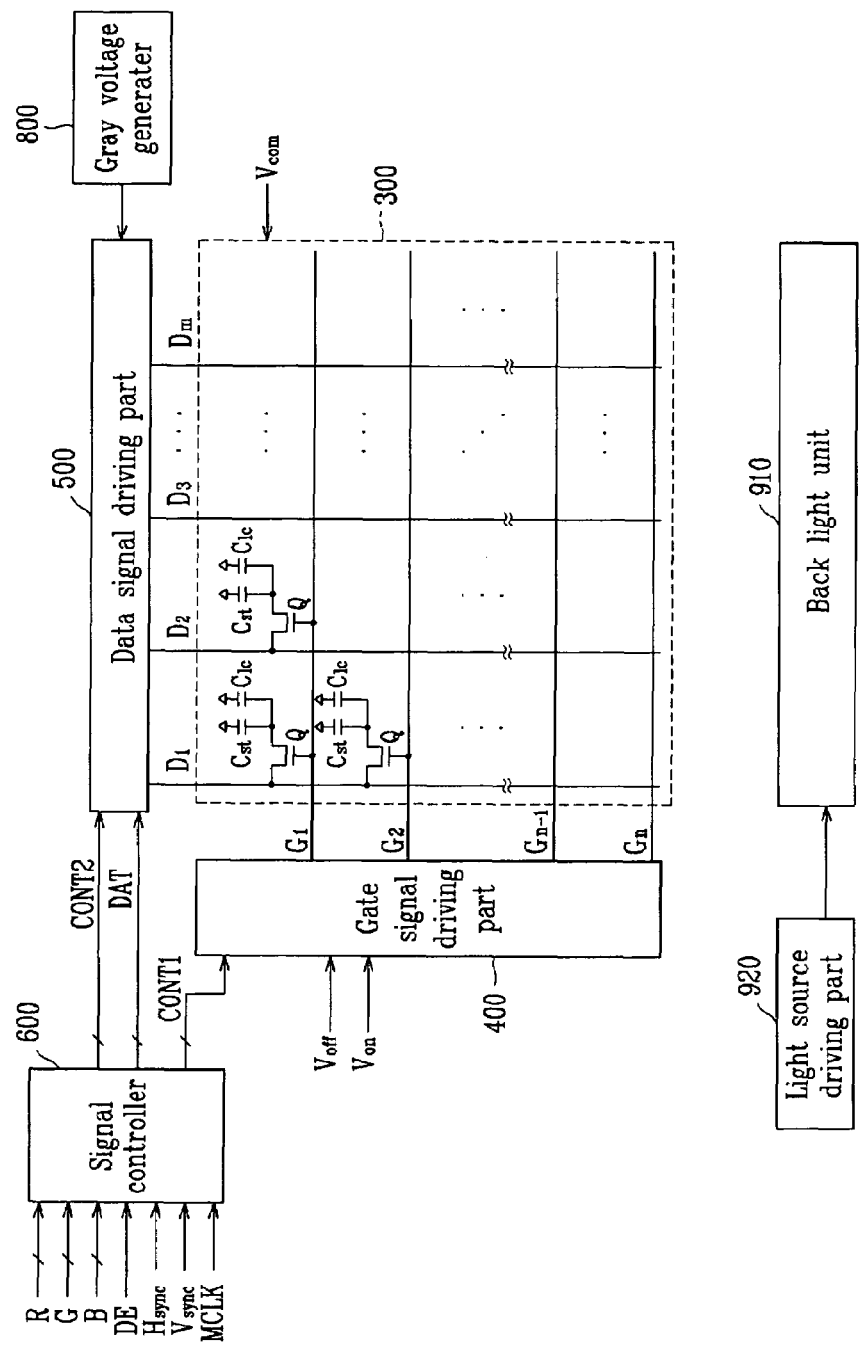
FIG. 1 shows a block diagram of an exemplary embodiment of a liquid crystal display of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower" and "upper" and the like, may be used herein for ease of description to describe the relationship of one element or feature to another element (s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

As shown in FIG. 1, an exemplary embodiment of the present invention includes a liquid crystal panel assembly 300, a gate signal driving part 400 coupled to the liquid crystal panel assembly 300, a data signal driving part 500 coupled to the liquid crystal panel assembly 300, a gray voltage generating part 800 coupled to the data driving part 500, a back light unit 910, a back light unit driving part 920, and a signal controller 600.

Figure 2:
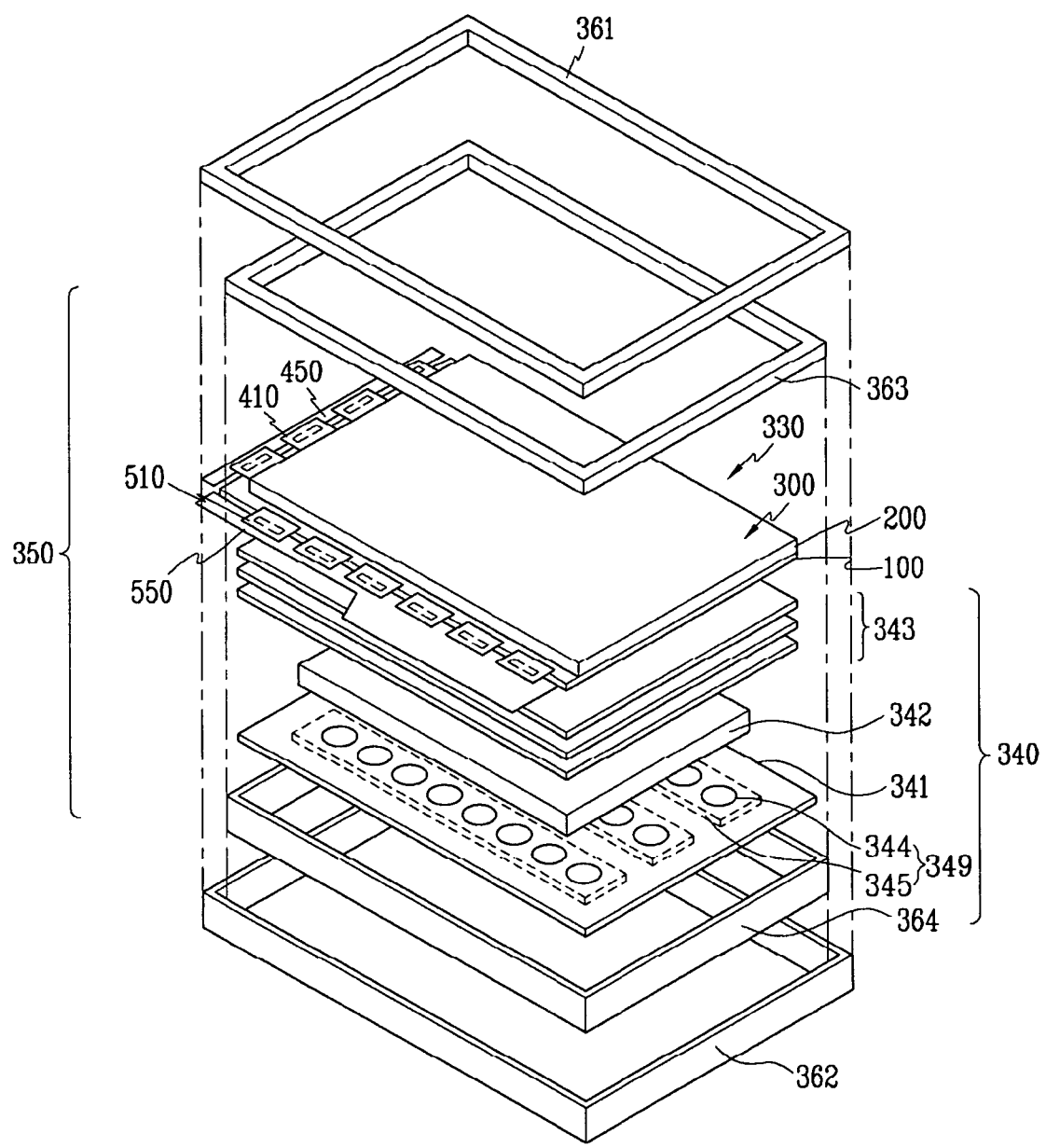
FIG. 2 shows an exploded perspective view of an exemplary embodiment of a liquid crystal display of the present invention.

As shown in FIG. 2, an exemplary embodiment of the present invention includes a liquid crystal display module 350 comprising a display portion 330, a set of back light parts 340, a front chassis 361, a back chassis 362, a front mold frame 363, and a back mold frame 364.

The display portion 330 includes a liquid crystal panel assembly 300, a gate tape carrier package 410, a data tape carrier package 510, a gate printed circuit board 450, and a data printed circuit board 550.

As shown in FIG. 2, the set of back light parts 340 is assembled to the LC (liquid crystal) panel assembly 300. The set of back light parts 340 includes a light source assembly 349, a light guide plate 342, a set of optical sheets 343, a reflector 341, and the mold frame 364.

A light emitting diode (LED) 344 is mounted on a printed circuit board (PCB) 345, such that the LED 344 and the PCB 345 form a light source assembly 349. A light guide plate 342, a plurality of optical sheets 343, and a reflector 341 may be disposed between the light source assembly 349 and the LC panel assembly 300. In exemplary embodiments, the LED 344 may emit white light. In alternative exemplary embodiments, the LED 344 may include a combination of multiple LED 344, such as two or three. The multiple LED 344 further may include, but is not limited to, a white LED, a red LED, a green LED, a blue LED and any combination including at least one of the foregoing.

Referring again to FIG. 1, the back light unit driving portion 920 controls the current applied to the back light unit 910, and turns on or turns off the light emitting diode 344. Thus the back light unit driving portion 920 controls the intensity of the back light unit 910.

A lens for an LED back light is described hereinafter with reference to FIGS. 4 and 5. The lens for an LED back light is designed to apportion front brightness and inclined brightness properly. The lens for an LED back light is also designed to transmit light uniformly and well. In an exemplary embodiment, the lens is disposed between the light source 349 and the light guiding plate 342. In other exemplary embodiments, multiple lenses may be disposed between the light source 349 and the liquid crystal display panel 300.

Figure 3:
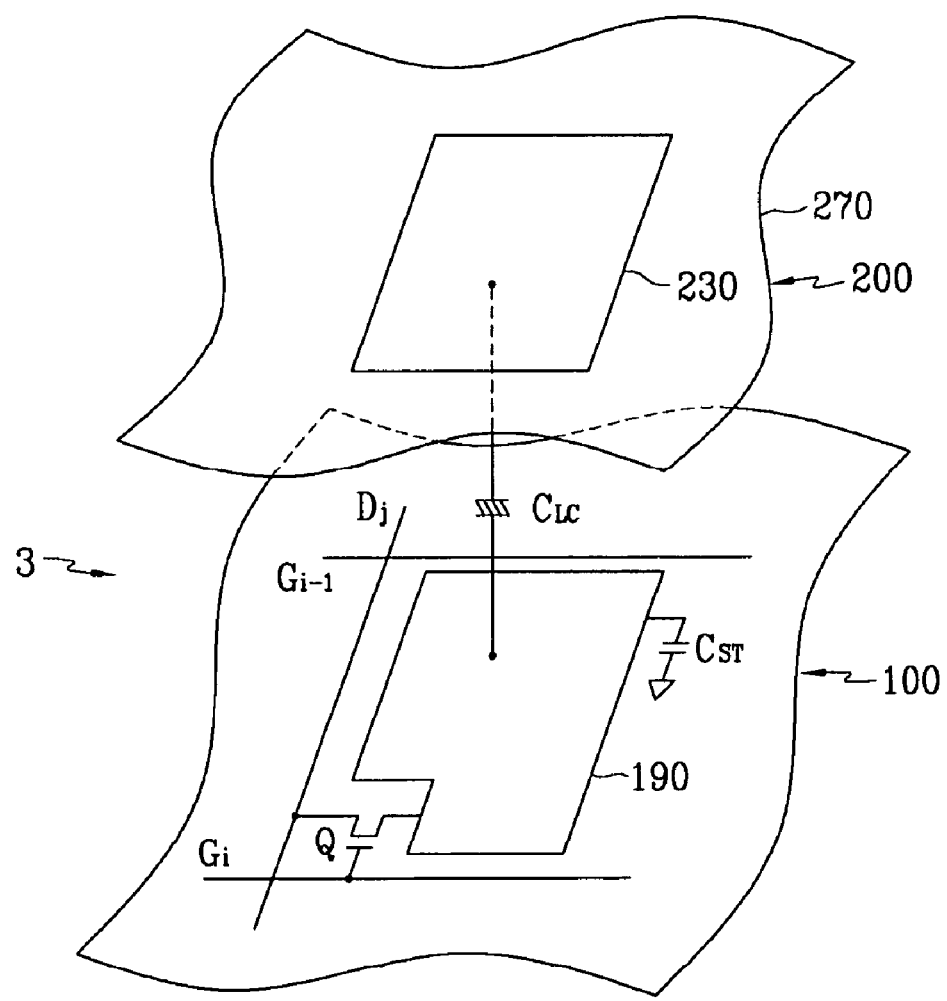
FIG. 3 shows an equivalent circuit of an exemplary embodiment of a pixel of a liquid crystal display of the present invention.

As shown in FIG. 3, a pixel electrode 190 may be formed on an array substrate 100 of the LC panel assembly 300. A common electrode 270 may be formed on an opposing substrate 200. LC layer 3 may be inserted between the array substrate 100 and the opposing substrate 200. The alignment of LC molecules in the LC layer 3 may be controlled by an electric field applied between the pixel electrode 190 and the common electrode 270. The alignment of the LC molecules may control the transmittance of light coming from the back light unit.

In order to embody color display, each pixel may display colors. The color display is possible by disposing a color filter 230 for one of three colors including, but not limited to, such colors as red, green, and blue in a region corresponding to the pixel electrode 190. The color filters 230 are formed on the opposing substrate 200 in FIG. 3, but in alternative exemplary embodiments, the color filters 230 may be formed above or below the pixel electrodes 190 on the array substrate 100.

Figure 4:
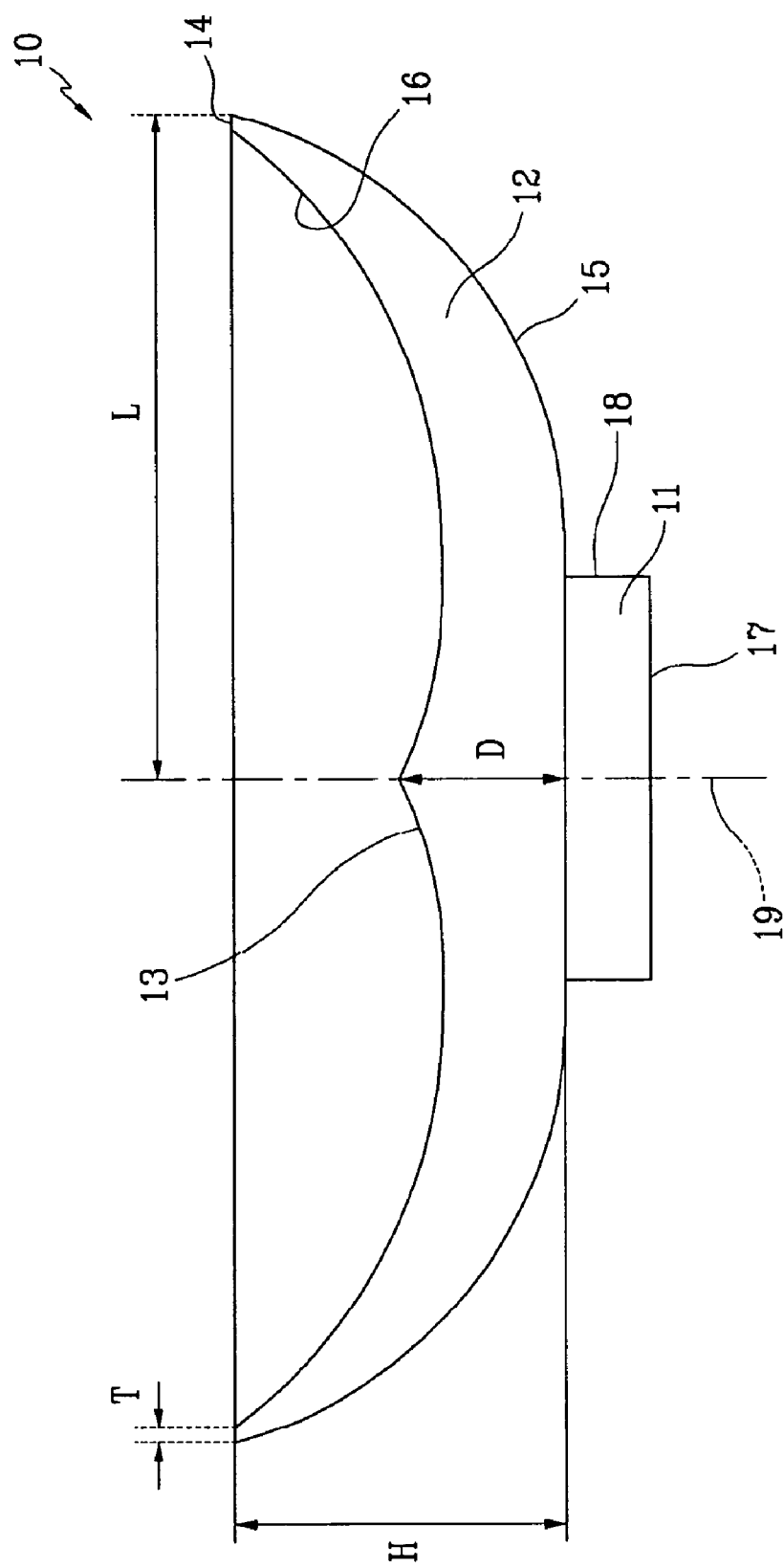
FIG. 4 shows a cross sectional view of an exemplary embodiment of a lens of the present invention.

As shown in FIG. 4, an exemplary embodiment of a lens 10 for an LED back light 340 of the present invention includes a light incidence part 11 and a lens bowl 12. The lens bowl 12 is substantially concave in shape as illustrated in FIG. 4. The lens bowl 12 has a dispersion protrusion 13 disposed substantially at the inner center area of the concave portion. The light incidence part 11 is disposed on the outer area of the concave portion of the lens bowl 12 and may contact the light outgoing portion of an LED 344. The light incidence part 11 is disposed substantially centered relative to the lens bowl 12, but may be positioned anywhere along the lens bowl 12 as is suitable for the purpose described herein. A light comes into the lens 10 through the light incidence part 11. The lens bowl 12 is formed on the light incidence part 11.

The lens bowl 12 has a first curved surface 15 and a second curved surface 16. The first curved surface 15 forms the lower surface of the lens bowl 12. The first curved surface 15 extends from an edge of the light incidence part 11. The first curved surface 15 curves substantially in an upper direction. The second curved surface 16 forms an upper surface of the lens bowl 12. In an exemplary embodiment, the light incidence part 11 may be disposed between the first curved surface 15 and the light source 349.

A dispersion protrusion 13 is formed along the curvature of the second curved surface 16. The dispersion protrusion 13 may be formed at the area of an imaginary axis 19 that penetrates the center of the lens 10. The dispersion protrusion 13 may include a meeting of ends of portions of the second curved surface 16. As illustrated in FIG. 4, a first portion of the second curved surface 16 (to the left of the axis 19) and a second portion of the second curved surface 16 (to the right of the axis 19) have a substantially concave shape. Ends of the first portion and the second portion are shown to meet substantially at a point. The point at which ends of the first portion and the second portion meet may form a substantially "V" shape or include a curved portion. The dispersion protrusion 13 may include the point at which ends of the first portion and the second portion meet and/or a part of the first portion and the second portion of the second curved surface 16 adjacent to the point.

The first curved surface 15 may meet the second curved surface 16. In other exemplary embodiments, a connecting or wing surface 14 may be formed substantially between ends of the first curved surface 15 and the second curved surface 16, such that the first curved surface 15 does not meet the second curved surface 16, as illustrated in FIG. 4. Essentially, the wing 14 couples the curvatures of the first curved surface 15 and the second curved surface 16. In exemplary embodiments, due to the shape of the first curved surface 15 and the second curved surface 16, if the first curved surface 15 and the second curved surface 16 were extended (e.g. imaginary extensions) past a point of meeting the surface 14, these imaginary extensions may ultimately meet each other.

As illustrated in FIG. 4, the connecting surface or edge 14 may extend substantially horizontally. In other exemplary embodiments, the surface 14 may extend in an upward or downward direction between the first curved surface 15 and the second curved surface 16 (tilted), include a curved portion, include a stepped portion or be of any shape or extend in any direction such as is suitable for the purpose described herein.

The shape of the lens 10 may also be formed by rotating a body or shape about an axis of rotation. In exemplary embodiments, a basic shape for the rotation may be formed with a plurality of lines of the light incidence part 11. Referring to FIG. 4, a first extension 17 may be formed with a right angle or substantially perpendicular to the imaginary rotation axis 19. One end of the first extension 17 meets or is located at the imaginary axis 19. The other end of the first extension 17 is connected to one end of a second extension 18. The second extension 18 extends substantially in an upper direction towards the lens 10 and may be considered as defining a height of the light incidence part 11. In exemplary embodiments, the second extension 18 may be substantially parallel to the imaginary axis 19 or substantially perpendicular to a bottom of the lens 10. The other end of the second extension 18 is connected proximate to one end of the first curve 15. The other end of the first curve 15 is located in a direction substantially upwards from the one end of the first curve 15, and farther from the one end of the first curve 15. The other end of the first curve 15 may be connected to one end of the second curve 16 or be separated from the one end of the second curve 16, such as by the surface 14 illustrated in FIG. 4. The other end of the second curve 16 meets or is placed at the imaginary axis 19.

The extensions and/or curves 15, 16, 17, 18, and the imaginary axis 19 form a plane figure. A revolution of the plane figure with respect to the imaginary axis 19 forms a body of revolution. The body of revolution substantially corresponds to the shape of the lens 10. The body of revolution would include a substantially circular lens 10, including a circular outer edge, when viewed from the top. The plane figure defined by the first line 17, second line 18, portion of the first curved surface 15 of the light incidence part 11 and the axis 19, would form a substantially cylindrical shape when rotated about the axis 19. In exemplary embodiments, the surfaces of the cylindrical shape created by the first line 17 and the portion of the first curved surface 15 being rotated about the axis 19 may be substantially parallel to each other and substantially perpendicular to the axis 19.

The surface 14 may be formed between the other end of the curve 15 and the one end of the second curve 16. In exemplary embodiments, the surface 14 may be substantially parallel to the first extension 17, as illustrated in FIG. 4, or substantially parallel to the surface of the cylindrical shape created by the rotation of the first line 17 about the axis 19 discussed above. In other exemplary embodiments, the first and second extensions 17 and 18 may be substantially straight lines.

The curvature of the curved surfaces 15 and 16 may vary along the curved surfaces 15 and 16 and/or may change continuously. The curvature of the first curved surface 15 is a first variable curvature. The curvature of the second curved surface 16 is a second variable curvature.

Figure 5:
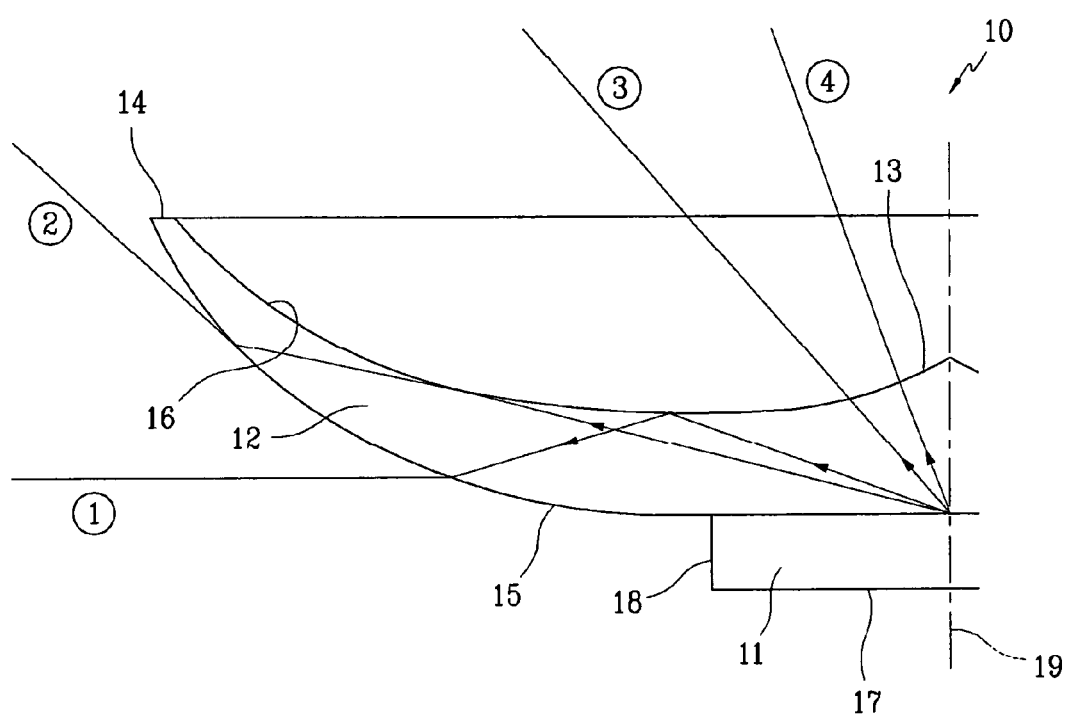
FIG. 5 shows light paths going through an exemplary embodiment of an optical lens of the present invention.

FIG. 5 shows four light paths indicated by the circled reference numbers 1-4 (hereinafter indicated as [1], [2], [3] and [4], respectively. The first path [1] illustrates a light from the light incidence part 11. The light is reflected on the second curved surface 16. The light is refracted on the first curved surface 15, and exits the first curved surface 15 in a substantially horizontal or lateral direction. Referring again to FIG. 2, the light is reflected at the reflection plate 341 of the back light part 340, and goes into the LC panel 300.

The second path [2] illustrates a light from the light incident portion 11. The light goes through the lens body 12, and is refracted at the first curved surface 15. The light exits the first curved surface 15 and travels into the LC panel 300 in a substantially inclined direction relative to the first curved surface 15, in a substantially upward direction away from the light incidence portion 11 and axis 19.

The third path [3] illustrates a light from the light incident portion 11. The light exits the lens 10 proximate the protrusion 13. The light is refracted at the second curved surface 16, and goes into the LC panel 300 in an inclined direction away; from the light incidence portion 11 and axis 19.

The fourth path [4] illustrates a light from the light incident portion 11. The light exits the second curved surface 16 with at an angle, such that the light is not substantially refracted by the second curved surface 16.

The shape of the lens 10 disperses the light coming from the LED 344. The dispersion ratio of the light depends on the shape of the lens 10.

There are many factors in the shape of the lens. Referring again to FIG. 4, the radius "L" of the lens 10, the height "H" of the lens body 10 (or of the first curved surface 15), the width or thickness "T" of the surface 14, the height or thickness "D" of the lens at the dispersion protrusion 13, the variable curvatures of the first curve surface and the second curved surface are factors that may determine the dispersion character and transmittance. In an exemplary embodiment, a radial distance from a center of the lens 10 to the outer edge of the lens may be greater than 1/10 of the radius "L" of the lens, such as is illustrated in FIG. 4. In another exemplary embodiment, a radial distance from a center of the lens 10 to the outer edge of the lens may be less than ½ of the radius "L" of the lens. In another exemplary embodiment, a width or thickness "T" of the edge in a radial direction of the lens may be between 0.1 mm and 0.3 mm.

Height "H" of the lens body 10 represents the overall height or thickness of the lens 10. Height "H" is measured in a direction substantially parallel to the axis 19 and in a direction substantially perpendicular to a tangential plane of the bottom of the lens body 10 and of the further point away from the light incidence surface 11 of the surface 14. The length or thickness "T" of the surface 14 is measured along a direction substantially perpendicular to the axis 19 and represents a distance between the first and the second curved surfaces 15 and 16 at the furthest point along the first and the second curved surfaces 15 and 16 away from the light incidence portion 11. The height or thickness "D" of the lens 10 at the dispersion protrusion 13 is measured in a direction substantially parallel to the axis 19 and in a direction substantially perpendicular to a tangential plane of the bottom of the lens body 10 to the highest point (or meeting point) of the dispersion protrusion 13.

To illustrate how the factors affect the dispersion ratio, experimental results are provided in the following discussion. The curvature of the second curved surface 15 may be expressed by a representative variable value. Variable curvature value 70 of the second curved surface 15 may represent a critical or diverging point in the formation of the dispersion protrusion 13. A variable curvature value smaller than 70 of the curvature may not form the dispersion protrusion 13 on the second curved surface 16. A variable curvature value larger than 70 forms the dispersion protrusion 13. The larger the variable curvature value is, the larger the height "D" of the dispersion protrusion 13.

Figure 14:
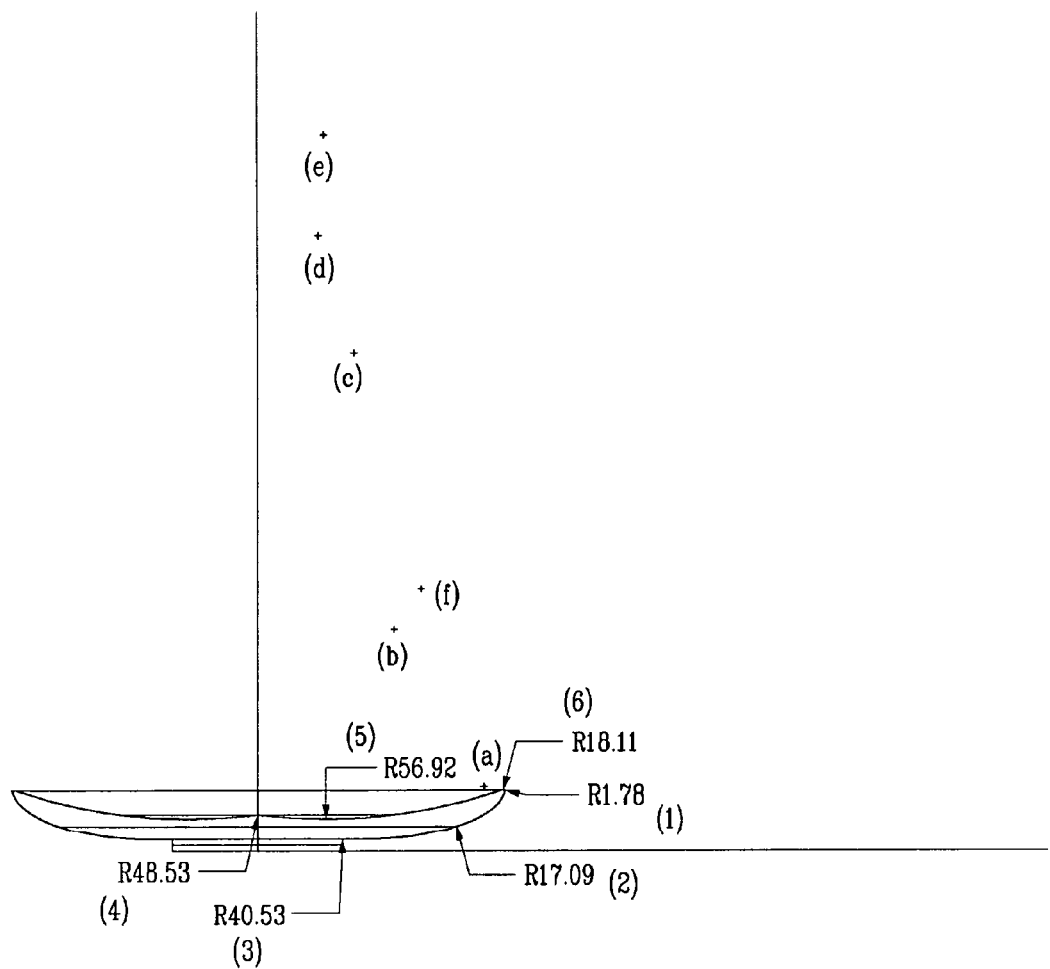
FIG. 14 shows a cross sectional view of another exemplary embodiment of a lens of the present invention.
Figure 15:
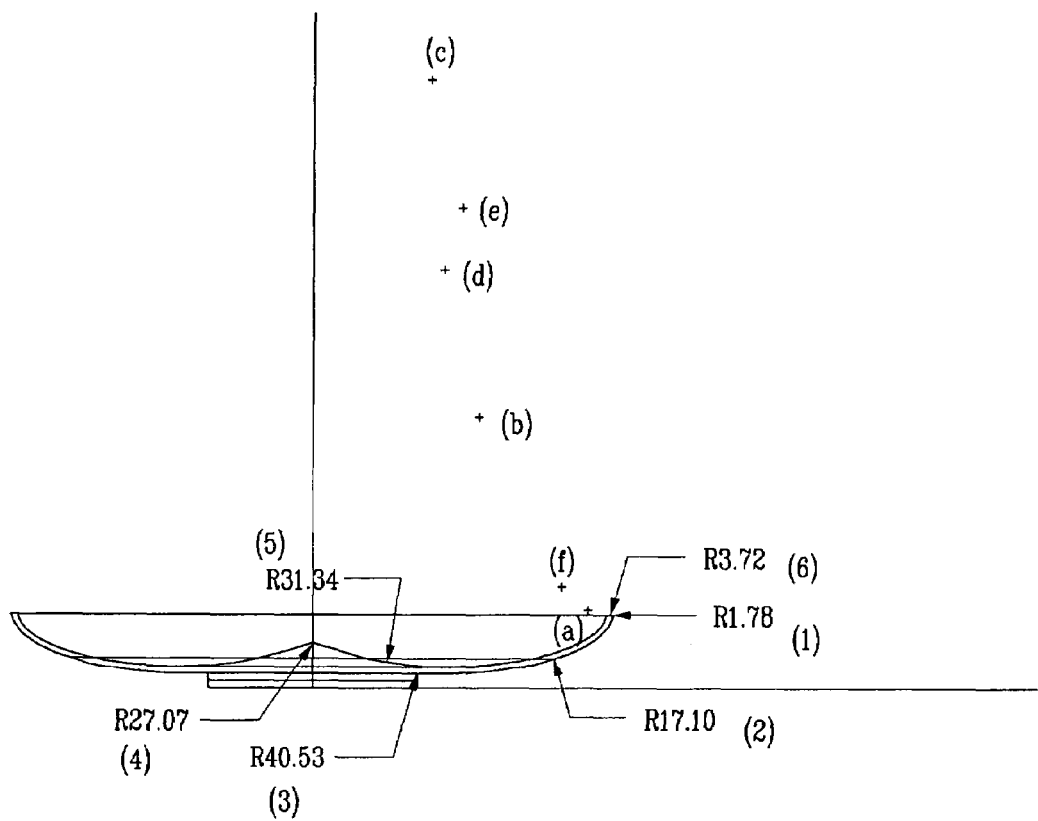
FIG. 15 shows a cross sectional view of another exemplary embodiment of a lens of the present invention.

As shown in the exemplary embodiment of FIG. 14, when the variable curvature value of the second curved surface 16 is 70, the radius of the curvature increases from 18.11 mm at the edge of the lens (proximate the point at which the first and second curved surfaces 15 and 16 converge) to 56.92 mm at a point along the second curved surface 16 nearer the center of the lens, then diminishes to 48.53 mm at the center of the lens 10. FIG. 15 illustrates an exemplary embodiment where the variable curvature value is 100. The radius of the curvature varies from 3.72 mm at the edge of the lens to 31.34 and finally 27.07 mm at the center of the lens.

The larger variable curvature value represents a smaller average curvature. In exemplary embodiments, the shape or curvature of the curved surface substantially corresponds to the form and parameters illustrated in FIG. 4, FIG. 5, FIG. 14, and FIG. 15.

The curvature of the first curved surface 15 can be determined as shown in the following example. In FIG. 14, the radius of the curvature varies from 18.11 mm at the edge of the lens to 48.53 mm at the center of the second curved surface 16. In FIG. 15, the radius of the curvature varies from 3.72 mm at the edge of the lens to 27.07 mm at the center of the second curved surface 16. The points a, b, c, d, e, and f of FIGS. 14 and 15 indicate center points of the radii of the curvatures 1, 2, 3, 4, 5, and 6, respectively. The curvatures 1, 2, and 3 indicate the curvatures of the first curved surface 15. The curvatures 4, 5, and 6 indicate the curvatures of the second curved surface 16.

Figure 6:
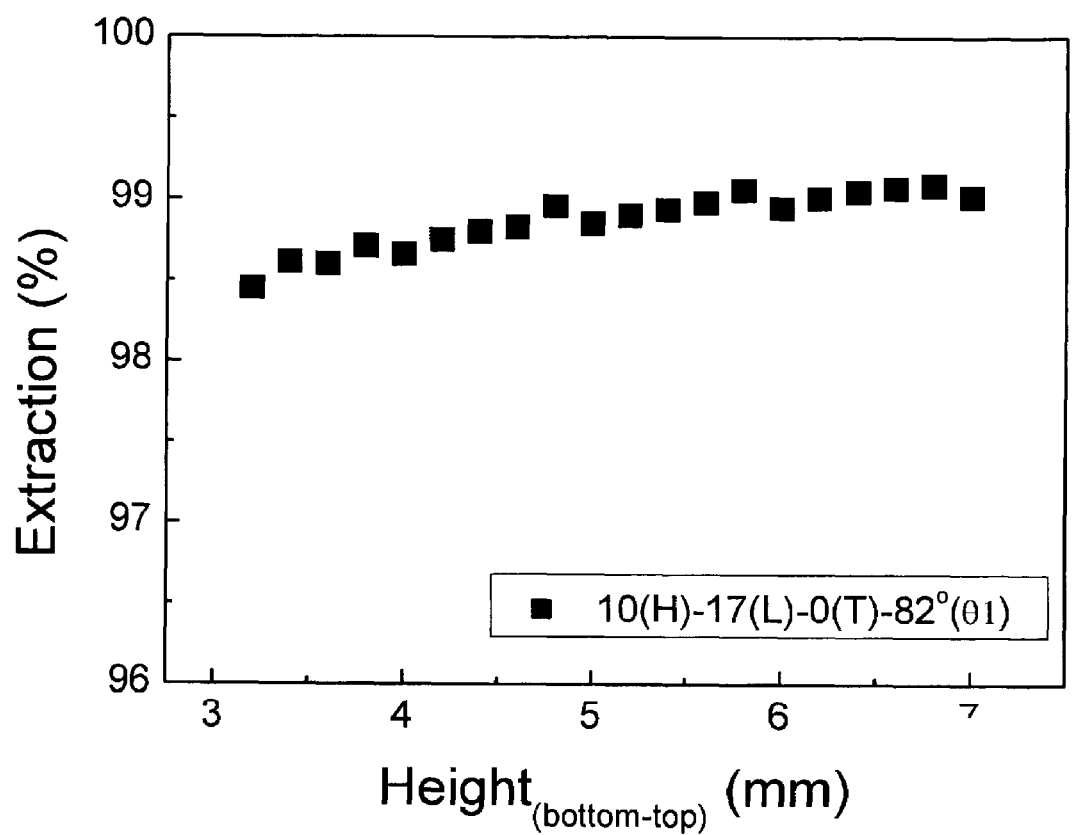
FIG. 6 shows light transmitting percentage with respect to the thickness of an exemplary embodiment of an optical lens of the present invention.

Referring now to FIG. 6, an exemplary embodiment of transmittance dependency on the center thickness "D" is illustrated. For this embodiment, the lens length "L" is 17 mm. The lens height "H" is 10 mm. The edge thickness "T" is 0 mm. The second curvature representative value is 82. The longer or larger the center distance "D", the more the light is transmitted, but the deviation is less than about 1%. When "D" (Height (bottom-top)) is 7 mm, for example, the transmittance (or extraction) is 99.02%.

Figure 7:
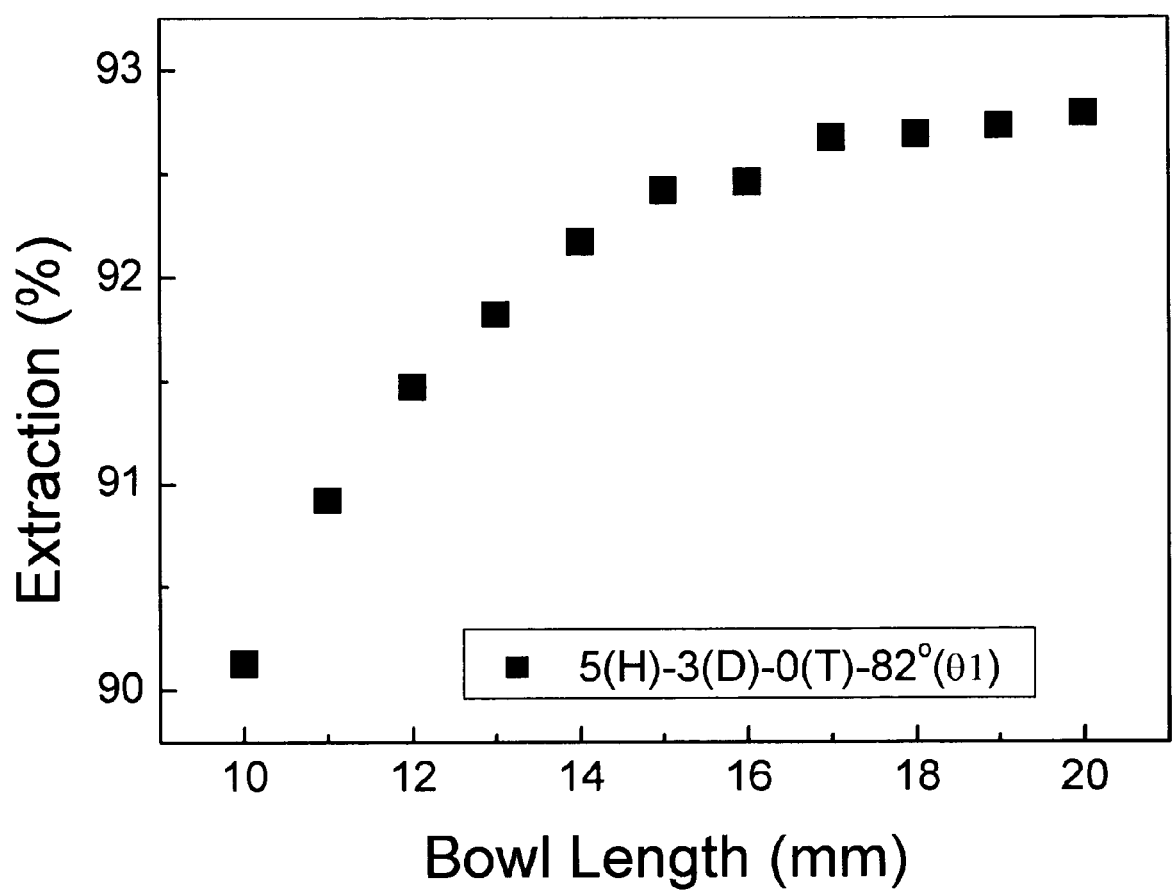
FIG. 7 shows a light transmitting percentage with respect to the radius of an exemplary embodiment of an optical lens of the present invention.

FIG. 7 shows transmittance ratio with reference to an exemplary embodiment including the lens length "L". The lens length "L" indicates the radius of the lens, as discussed above. The height "H" of the lens bowl is 5 mm. The center thickness "D" of the lens is 3 mm. The edge thickness "T" of the lens bowl is 0 mm. The curvature representative value is 82. The longer the lens length "L", the more light is transmitted. As illustrated in FIG. 7, the transmittance ratio of the light starts to saturate at the length "L" being 18 mm of the lens body.

Figure 8:
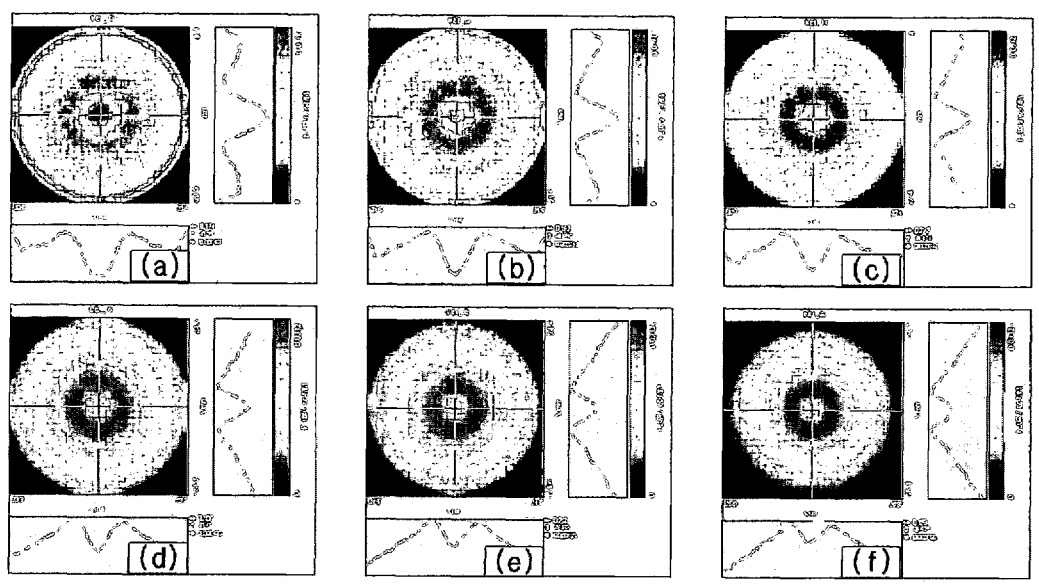
FIG. 8 shows light distribution dependency on the radius of an exemplary embodiment of an optical lens of the present invention.

FIG. 8 depicts the distribution of light with reference to exemplary embodiments including the lens length "L". The lens lengths represented in the figures (a), (b), (c), (d), (e), and (f) are 10 mm, 12 mm, 14 mm, 16 mm, 18 mm, and 20 mm, respectively. Lower light intensities are illustrated as darker areas and higher light intensities are illustrated as lighter-shaded areas.

FIG. 8(a) shows low light intensity at the center area. The light intensity increases as a distance from the center area initially increases, and then the light intensity decreases as the distance continues to increase from the center area. Here, the light distribution uniformity is not optimal where the lens length (radius) "L" is 10 mm.

As shown FIG. 8 (b), (c), (d), (e), and (f), the longer lens length (radius) "L" creates a more uniform distribution of light. That is the contrast between low light intensities and higher light intensities when moving away from the center decreases.

Figure 9:
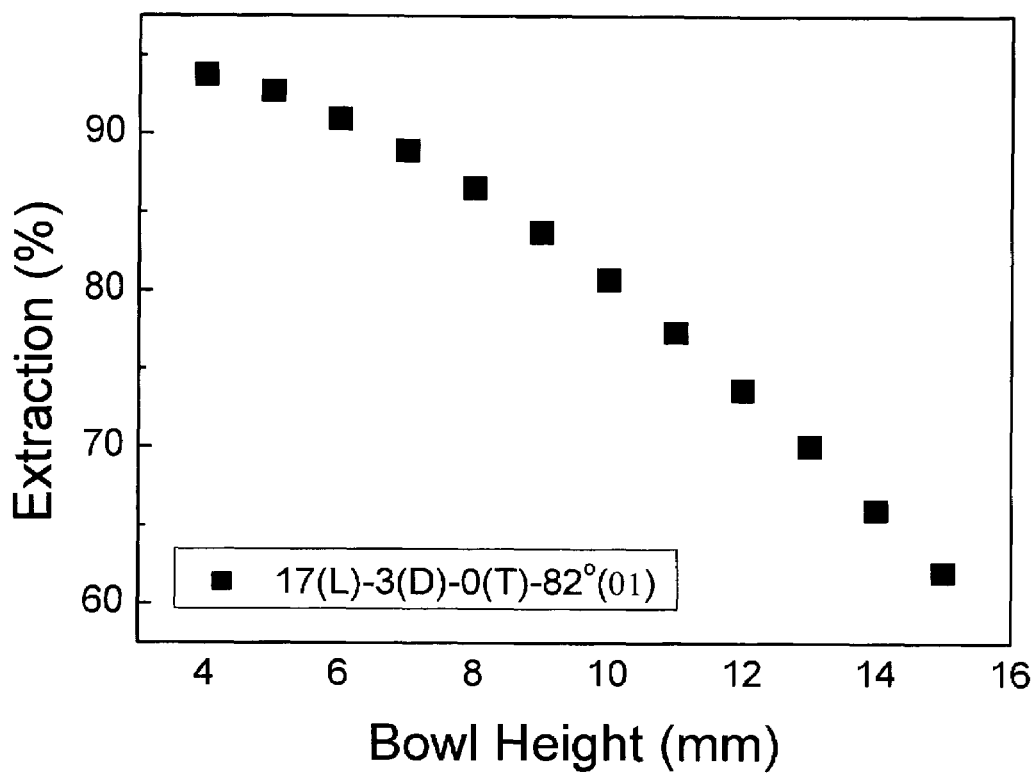
FIG. 9 shows light transmitting percentage with respect to the thickness of the bowl of an exemplary embodiment of a lens of the present invention.

FIG. 9 shows light transmittance ratio with reference to an exemplary embodiment of a lens bowl height "H". The lens length (lens radius) "L" is 17 mm. The center thickness "D" of the lens is 3 mm. The edge thickness "T" of the lens bowl is 0 mm. The representative value of the curvature of the second curved surface 16 is 82. The larger the bowl height "H" of the lens bowl, the less light is transmitted. As the bowl height "H" increases from 4 mm to 14 mm, the extraction (light transmittance ratio) decreases from approximately 93% to about 63%.

From the FIGS. 7, 8, and 9, it may be concluded that the lens bowl may allow increased light transmittance when the lens bowl is configured to be wider and thinner.

Figure 10:
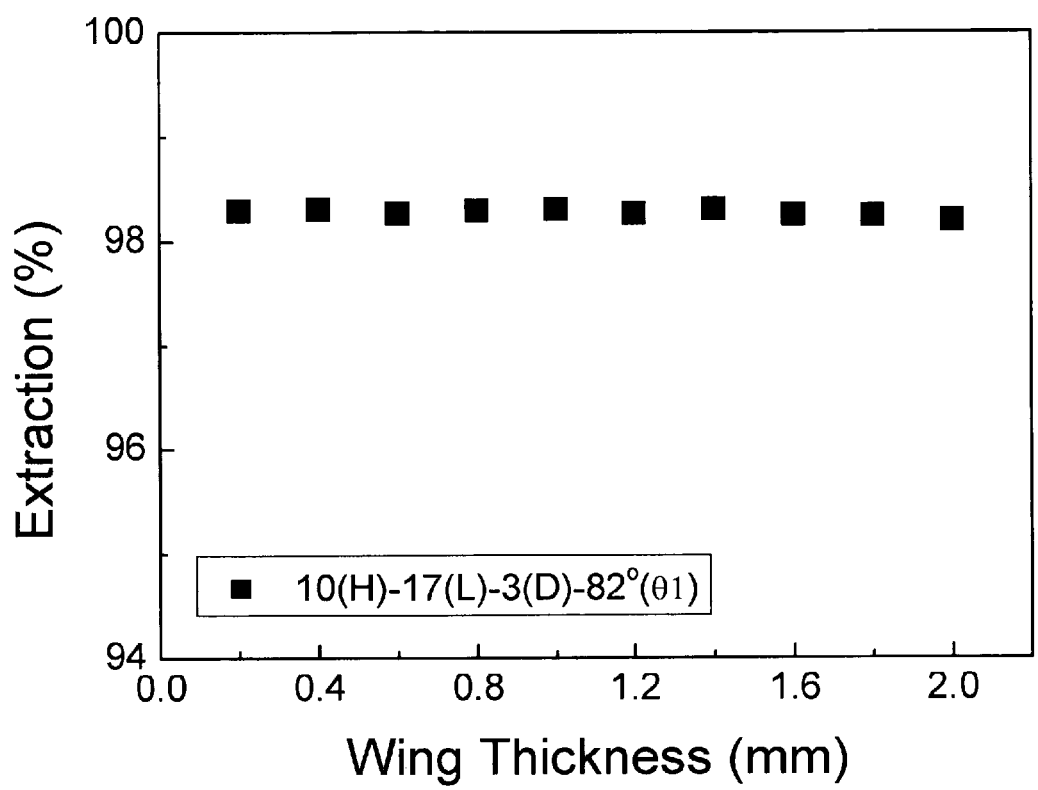
FIG. 10 shows light transmitting percentage with respect to the width of a horizontal portion of an exemplary embodiment of an optical lens of the present invention.

FIG. 10 shows light transmittance ratio with respect to an exemplary embodiment including the edge thickness "T" of the lens body 12. The height "H" of the lens bowl is 10 mm. The lens length (lens radius) "L" of the lens bowl is 17 mm. The center thickness "D" of the lens is 3 mm. The representative value of the curvature of the second curved surface 16 is 82. As shown in FIG. 10, the transmittance of light does not depend substantially on the wing edge thickness "T" of the lens body.

Figure 11:
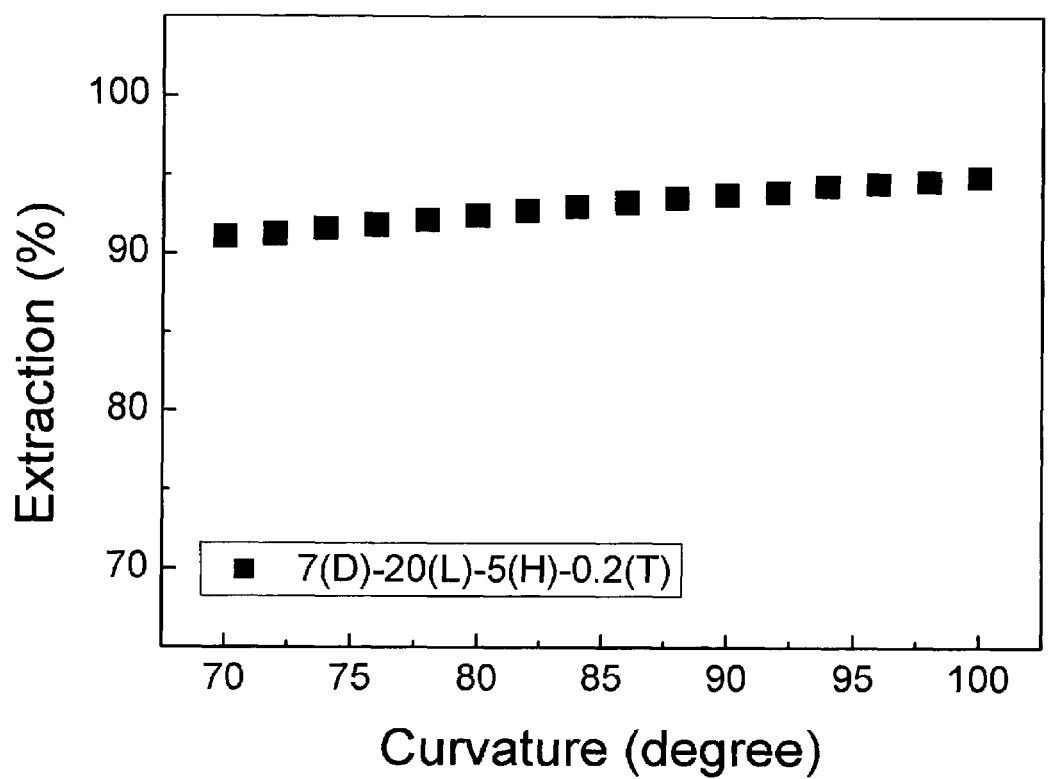
FIG. 11 shows light transmitting percentage with respect to the second variable curvature of an exemplary embodiment of a lens of the present invention.

FIG. 11 shows light transmittance ratio with respect to an exemplary embodiment including the curvature of the second curved surface. The height "H" of the lens bowl is 5 mm. The lens length (lens radius) "L" of the lens bowl is 20 mm. The center thickness "D" of the lens is 7 mm. The edge thickness "T" of the lens bowl is 0.2 mm.

The larger the representative value (degree) of the curvature, the more light is transmitted. The larger representative curvature value of the second curved surface 16 may form a deeper (larger "D") dispersion protrusion 13, such that the deeper dispersion protrusion 13 allows more light to be transmitted.

Figure 12:
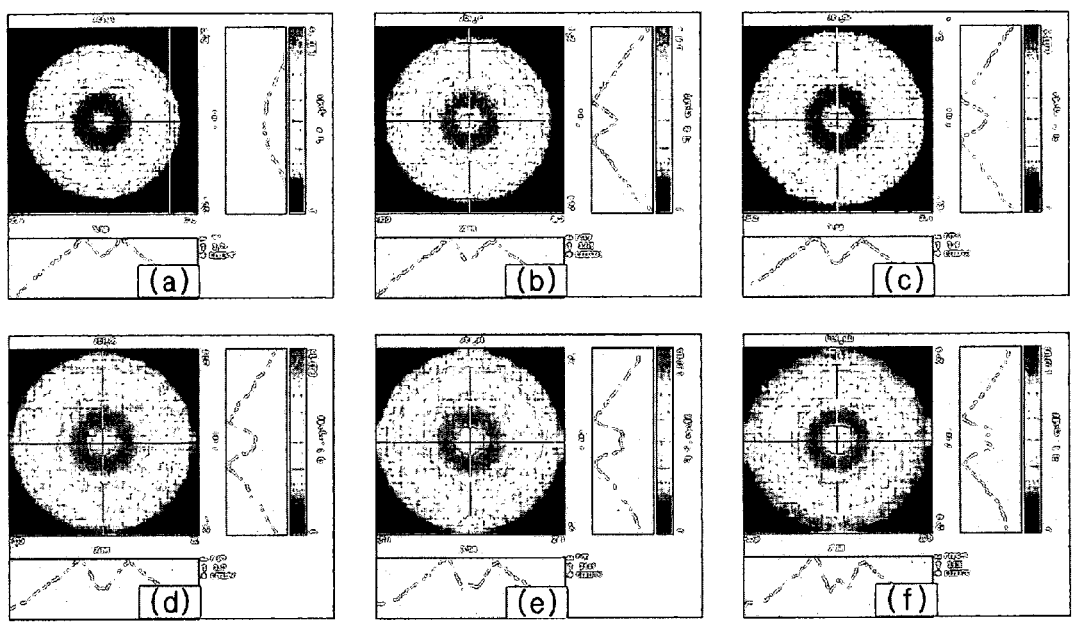
FIG. 12 shows light distribution dependency on the second variable curvature of an exemplary embodiment of a lens of the present invention.

FIG. 12 shows the light distribution of the lenses of the FIG. 11. The representative curvatures of (a), (b), (c), (d), (e), and (f) in FIG. 12 include 70, 76, 82, 88, 94, and 100, respectively.

The representative curvatures represent the variable curvature of the second curved surface 16. The representative curvatures may be identified by the simulation program developed by BRO (Breault Research Organization) Co. LTD. The brand of the simulation program is ASAP (Advanced Systems Analysis Program).

The light distribution areas are shown in Table 1 below.

TABLE 1

| Curvature Representative | Radius (mm) of the light distribution area |
|---|---|
| 70 | 20 |
| 76 | 24 |
| 82 | 25.1 |
| 88 | 26 |
| 94 | 27.1 |
| 100 | 29 |

Table 1 shows that the larger curvature representative value indicates an increased distribution of light.

Figure 13:
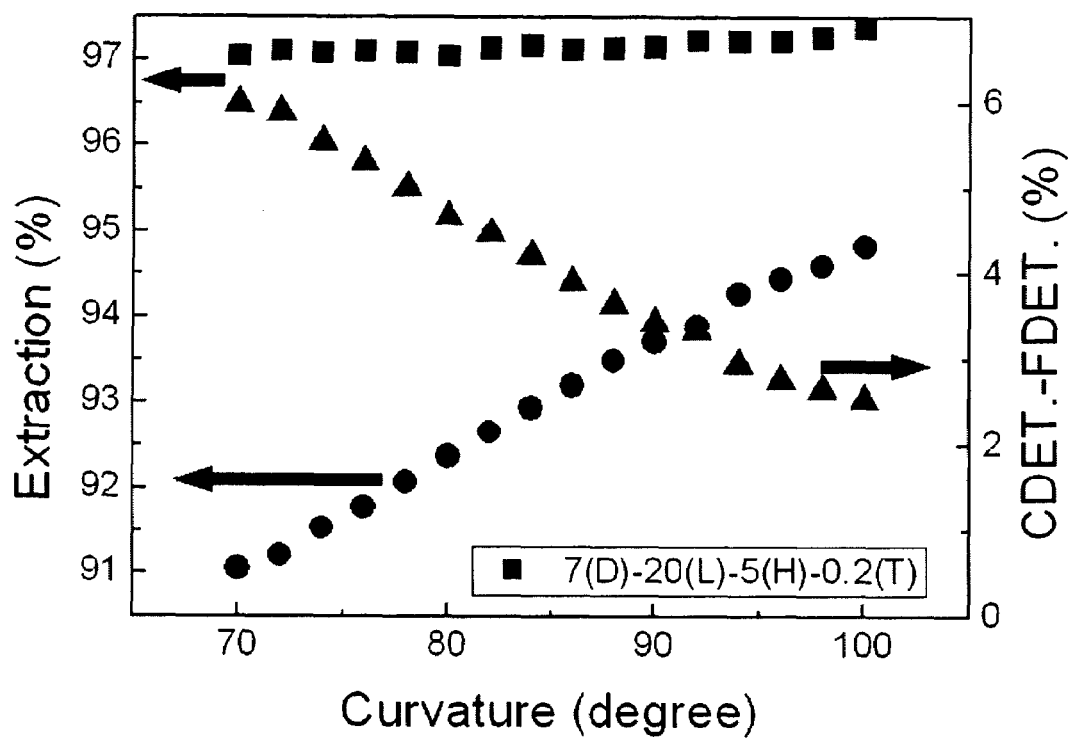
FIG. 13 shows light intensity detected by a hemisphere detector and a flat detector.

Referring to FIG. 13, the square dots show transmittance ratio of the light measured by a hemisphere detector and show the same data as illustrated in FIG. 11 discussed above. The hemisphere detector detects whole light exiting the lens and includes a light propagating incline direction. The circular dots show a transmittance ratio measured by a plane or flat detector (FDET) that cannot detect light propagating in a deeply inclined direction. The plane detector detects light going through a certain area at the top of the lens. In an exemplary embodiment, the lens for an LED of the present embodiment disperses light not only to the front direction but also to inclined directions.

The square dots in FIG. 13 show a transmittance ratio measured by a hemisphere or circular (curved) detector (CDET). The triangle dots show the differences between the square dots and the circular dots, so that the triangle dots represent the amount of light propagating in an inclined direction. The difference of the square dots and the circular dots, represented by the triangular dots, is indicated on the vertical axis labeled CDET-FDET (%).

FIG. 14, also discussed above, shows curvatures at various points of the first and the second variable curvatures of a lens whose representative curvature value is 70. In this case, the protrusion 13 is relatively small, and when the representative curvature value is less than 70, a protrusion 13 may not formed in the center area of the second curved surface 16.

FIG. 15, also discussed above, shows curvatures at various points of the first and the second variable curvatures of a lens whose representative curvature value is 100.

Figure 16:
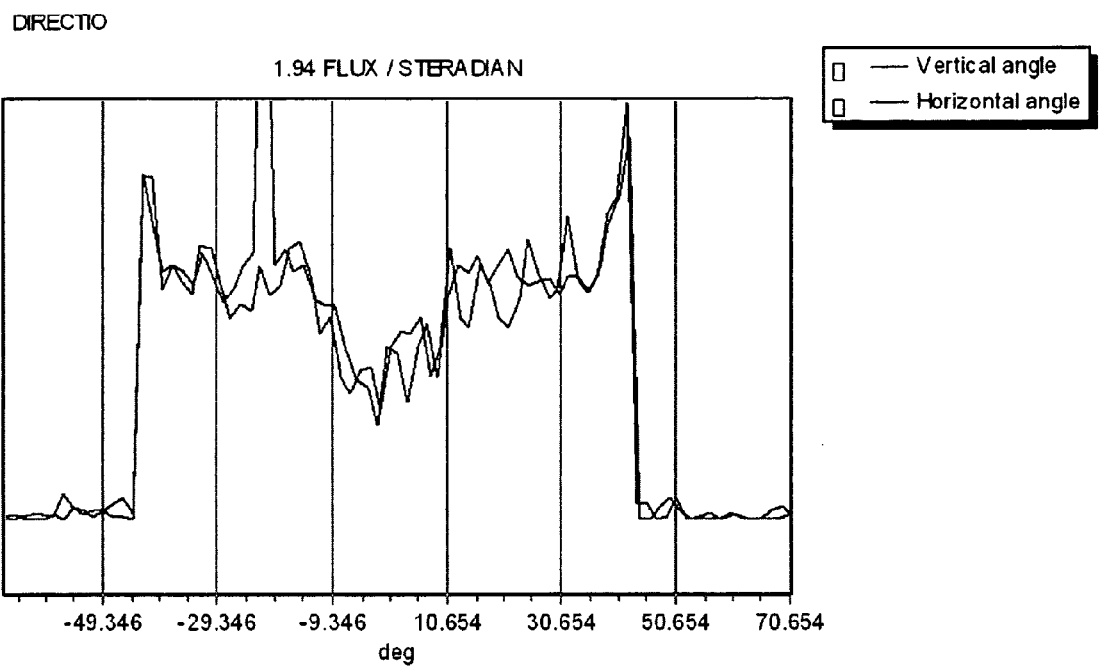
FIG. 16 shows a light distribution characteristics of an exemplary embodiment of an optical lens of the present invention.

FIG. 16 shows the inclination character of an exemplary embodiment of a lens for an LED back light of the present invention. The graph in FIG. 16 indicates a relatively uniform light propagation in a polar angle range within about 45 degrees.

Figure 17:
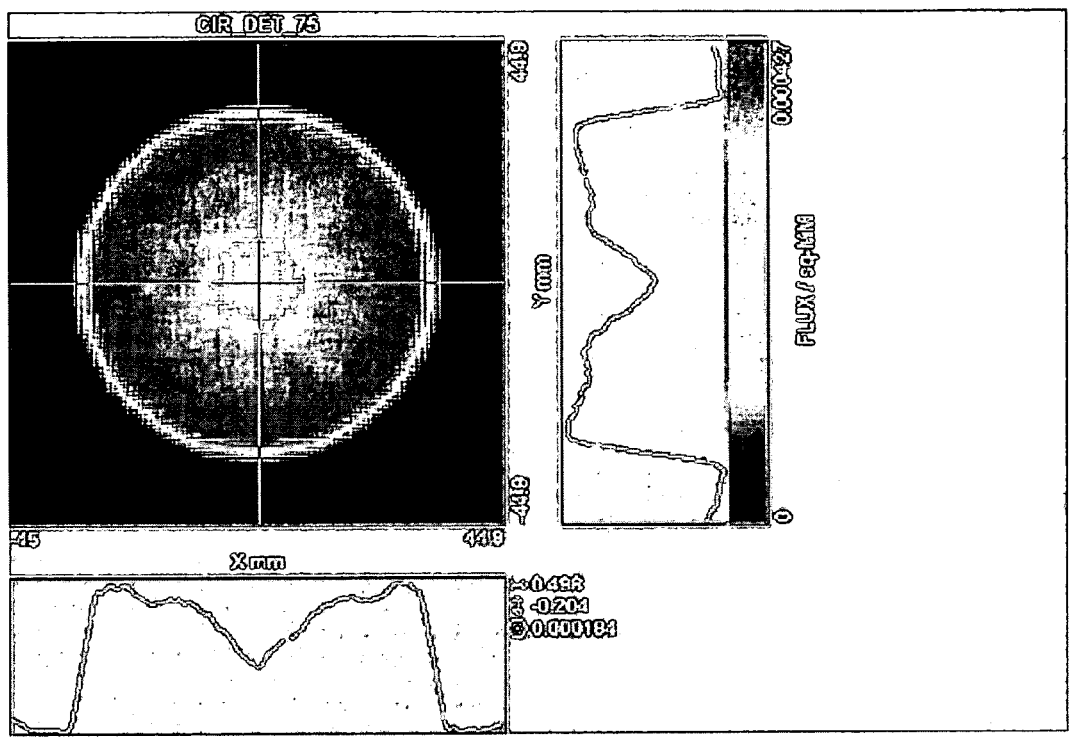
FIG. 17 shows a light distribution of an exemplary embodiment of an optical lens of the present invention.

FIG. 17 shows a light transmittance distribution of an exemplary embodiment of the present invention. The lens bowl height "H" is 5 mm. The lens length (lens radius) "L" is 20 mm. The center thickness "D" is 7 mm. The edge thickness "T" is 0.2 mm. The representative curvature value is 70 degree. A plane detector detected the light distribution 40 mm from the surface of the lens 10. FIG. 17 shows that the light intensity of the center is weaker than that of an area a distance away from the center, which may be induced by the dispersion protrusion 13. FIG. 17 illustrates a relatively uniform light distribution.

As shown in FIG. 17, while the lens radius is 20 mm, a light distribution radius, is about 30 mm. As discussed above, the lens 10 is disposed on the LED 344. The density (or quantity) of the lens 10 and the LED 344 included in the light source 349 may be designed as necessary to achieve uniform light distribution of the display device based on the light distribution radius of the lens 10. For instance, if the light distribution radius of a lens 10 is of a relatively larger dimension, the number (density) of lens 10 and the LED 344 included in the light source 349 to provide uniform light distribution of the display device may be less than the number of the lens 10 and LED 344 when the light distribution radius is relatively smaller. That is, the density of the lens 10 and LED 344 is defined such that the light collectively distributed by the lens 10 and LED 344 provides a uniform light distribution in the display device.

In an exemplary embodiment of the present invention, the lens for an LED back light is formed on an LED. The lens is disposed on or adheres closely to the LED to prevent light loss. An assistant (not shown) may be inserted between the lens and the LED so that the LED adheres closely to the lens.

A plurality of LEDs are mounted on a PCB (printed circuit board). The PCB is mounted on a back plane to form a back light unit. The PCBs may be mounted on the back chassis directly. A back light unit may comprise a plurality of PCBs mounted on a back plane or on a back chassis.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light source unit comprising:
   a light source; and
   a lens, the lens comprising:
      a first curved surface having a first variable curvature;
      a second curved surface having a second variable curvature; and
      a protrusion formed on a center area of the second curved surface,
      wherein a first end of the first curved surface is connected to a first end of the second curved surface at an outer edge of the lens;
      wherein the second variable curvature forms the protrusion on the second curved surface, and
      wherein a light entering the lens through the first curved surface is reflected by the second curved surface excluding the protrusion and is transmitted through the first curved surface in a substantially lateral direction.

2. The light source unit of claim 1, wherein the first end of the first curved surface and the first end of the second curved surface are connected by meeting each other at the outer edge of the lens.

3. The light source unit of claim 1, further comprising a light incidence part formed on the first curved surface.

4. The light source unit of claim 3, wherein the light incidence part is substantially cylindrical shaped.

5. The light source unit of claim 3, wherein a height of the first curved surface is between about 1 time and 5 times of the height of the light incidence part.

6. The light source unit of claim 1, further comprising an edge surface connecting the first end of the first curved surface and the second end of the second curved surface.

7. The light source unit of claim 1, further comprising an edge surface connecting the first variable curvature to the second variable curvature.

8. The light source unit of claim 7, further comprising:
   a cylindrical shaped light incidence part formed on the first curved surface, the edge surface being substantially parallel to a circular surface of the light incidence part.

9. The light source unit of claim 7, wherein the edge surface is substantially horizontal.

10. The light source unit of claim 7, wherein a width of the edge surface is between about 0.1 mm and about 0.3 mm.

11. The light source unit of claim 1, wherein a height of the protrusion from a bottom of the first curved surface is greater than 1/3 of a height of the first curved surface.

12. The light source unit of claim 11, wherein the height of the protrusion is less than 1/2 of the height of the first curved surface.

13. The light source unit of claim 12, wherein a radial distance from a center of the lens to the lowest portion of the second curved surface is less than 1/2 of the maximum radius of the lens.

14. The light source unit of claim 1, wherein a radial distance from a center of the lens to a lowest portion of the second curved surface is greater than 1/10 of a maximum radius of the lens.

15. The light source unit of claim 1, wherein a radius of the second variable curvature initially increases at a first radial distance from a center of the lens and then diminishes at a second radial distance from the center of the lens, the second radial distance being larger than the first radial distance.

16. The light source unit of claim 15, wherein a maximum radius of the second curvature is about 57 mm.

17. The light source unit of claim 15, wherein the minimum radius of the second curvature is about 18 mm.

18. The light source unit of claim 1, wherein a radius of the first variable curvature diminishes at a radial distance away from the center of the lens.

19. The light source unit of claim 18, wherein a maximum and a minimum radius of the first variable curvature are about 40 mm and about 2 mm, respectively.

20. The light source unit of claim 1 wherein the light source is disposed under the first curved surface.

21. The light source unit of claim 20, wherein the light source is light emitting diode.

22. The light source unit of claim 20, further comprising:
   a light incidence part, wherein the light incidence part is formed between the first curved surface and the light source.

23. A back light unit, comprising:
   the light source unit of claim 20;
   a light guiding plate formed on the light source unit; and
   a reflection layer disposed opposite the light guiding plate and reflecting the light reflected from the lens.

* * * * *